(12) United States Patent
Yasuda et al.

(10) Patent No.: US 8,611,704 B2
(45) Date of Patent: Dec. 17, 2013

(54) PHOTOELECTRIC CONVERSION MODULE

(75) Inventors: Hiroki Yasuda, Mito (JP); Kouki Hirano, Hitachinaka (JP); Yoshinori Sunaga, Hitachinaka (JP); Juhyun Yu, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 30 days.

(21) Appl. No.: 13/347,948

(22) Filed: Jan. 11, 2012

(65) Prior Publication Data
US 2012/0183253 A1 Jul. 19, 2012

(30) Foreign Application Priority Data
Jan. 18, 2011 (JP) ................................. 2011-008022

(51) Int. Cl.
*G02B 6/12* (2006.01)
(52) U.S. Cl.
USPC ............................................ 385/14; 398/139
(58) Field of Classification Search
USPC ................. 385/14, 40, 129; 438/28; 250/552; 340/760, 766; 439/620.21; 398/139; 372/26
See application file for complete search history.

(56) References Cited

U.S. PATENT DOCUMENTS

| | | | | |
|---|---|---|---|---|
| 5,037,765 A * | 8/1991 | Gaul et al. | ......... | 438/27 |
| 5,479,540 A * | 12/1995 | Boudreau et al. | ......... | 385/14 |
| 5,577,142 A * | 11/1996 | Mueller-Fiedler et al. | ......... | 385/47 |
| 5,600,741 A * | 2/1997 | Hauer et al. | ......... | 385/35 |
| 5,696,862 A * | 12/1997 | Hauer et al. | ......... | 385/88 |
| 5,764,832 A * | 6/1998 | Tabuchi | ......... | 385/49 |
| 5,805,755 A * | 9/1998 | Amersfoort et al. | ......... | 385/131 |
| 5,872,880 A * | 2/1999 | Maynard | ......... | 385/88 |
| 6,132,107 A * | 10/2000 | Morikawa | ......... | 385/89 |
| 6,257,772 B1 * | 7/2001 | Nakanishi et al. | ......... | 385/89 |
| 6,327,407 B1 * | 12/2001 | Mitsuda et al. | ......... | 385/49 |
| 6,438,281 B1 * | 8/2002 | Tsukamoto et al. | ......... | 385/14 |
| 6,504,107 B1 * | 1/2003 | Kragl | ......... | 174/260 |
| 6,512,861 B2 * | 1/2003 | Chakravorty et al. | ......... | 385/14 |
| 2002/0131727 A1 * | 9/2002 | Reedy et al. | ......... | 385/88 |
| 2005/0089276 A1 * | 4/2005 | Yoon et al. | ......... | 385/43 |
| 2005/0196095 A1 * | 9/2005 | Karashima et al. | ......... | 385/14 |
| 2008/0310854 A1 * | 12/2008 | Takai et al. | ......... | 398/139 |
| 2009/0016732 A1 | 1/2009 | Ueno et al. | | |
| 2009/0324171 A1 | 12/2009 | Yasuda et al. | | |

FOREIGN PATENT DOCUMENTS

| | | | | |
|---|---|---|---|---|
| JP | 57053716 A | * | 3/1982 | ............... G02B 7/26 |
| JP | 2009-21459 A | | 1/2009 | |
| JP | 2010-10254 A | | 1/2010 | |

* cited by examiner

*Primary Examiner* — Charlie Peng
*Assistant Examiner* — Peter Radkowski
(74) *Attorney, Agent, or Firm* — Holtz, Holtz, Goodman & Chick, PC

(57) ABSTRACT

A photoelectric conversion module includes: an IC chip and a photoelectric conversion element mounted on one surface of a circuit board having a light transmitting property and flexibility; an optical fiber having a tip portion disposed in a holding groove formed in a resin layer provided on another surface of the circuit board; a reinforcing member covering the holding groove; and an optical element optically coupling a tip of the optical fiber and the photoelectric conversion element via the circuit board. The holding groove has an open end at an end of the resin layer, the end of the resin layer being located on the IC chip side in terms of an arrangement direction of the IC chip and the photoelectric conversion element, and at least part of the tip portion of the optical fiber extends along the IC chip.

20 Claims, 5 Drawing Sheets

ARRANGEMENT DIRECTION D

PHOTOELECTRIC CONVERSION MODULE

BACKGROUND OF THE INVENTION

1. Field of the Invention

The present invention relates to a photoelectric conversion module.

2. Description of the Related Art

As transmission mediums, for example, in the connection between a server and a switch in a data center and in the connection between digital AV (audio visual) devices, optical fibers are also used in addition to metal wires. Further, in recent years, the use of optical fibers as transmission mediums, that is, optical interconnection, also in information processing devices such is as mobile phones and personal computers has been considered. Refer to Japanese Patent Application Laid-open No. 2009-21459, for instance.

When the optical fiber is used, a photoelectric conversion module converting an electrical signal to an optical signal or converting an optical signal to an electrical signal is required. For example, a photoelectric conversion module disclosed in Japanese Patent Application Laid-open No. 2010-10254 includes a flexible board, and on the flexible board, a light-emitting element or a light-receiving element is mounted as a photoelectric conversion element together with an IC chip. Further, an optical waveguide is formed integrally on the flexible board, and a tip portion of an optical fiber is fixed in a groove formed in the optical waveguide.

In the photoelectric conversion module disclosed in Japanese Patent Application Laid-open No. 2010-10254, the flexible board extends beyond a side surface of the IC chip, and the tip portion of the optical fiber is fixed to an extending portion of the flexible board. This has made it difficult to downsize the flexible board in this photoelectric conversion module. That is, this photoelectric conversion module has a problem that a length to fix the tip portion of the optical fiber to the flexible board becomes short if the flexible board is downsized, resulting in weak connection strength of the optical fiber.

SUMMARY OF THE INVENTION

It is an object of the present invention to provide a highly reliable photoelectric conversion module in which connection strength of a tip portion of an optical fiber is ensured even when it is downsized.

According to one aspect of the present invention, there is provided a photoelectric conversion module including: a circuit board having a light transmitting property and flexibility; an IC chip and a photoelectric conversion element mounted adjacent to each other on one surface of the circuit board; a resin layer provided on another surface of the circuit board and having a holding groove formed along the circuit board; an optical fiber having a tip portion disposed in the holding groove; a reinforcing member covering the holding groove of the resin layer; and an optical element optically coupling a tip of the optical fiber and the photoelectric conversion element via the circuit board, wherein: the holding groove has an open end at an end of the resin layer, the end of the resin layer being located on the IC chip side in terms of an arrangement direction of the IC chip and the photoelectric conversion element; and at least part of the tip portion of the optical fiber extends along the IC chip.

Further scope of applicability of the present invention will become apparent from the detailed description given hereinafter. The detailed description and embodiments are only given as examples though showing preferred embodiments of the present invention, and therefore, from the contents of the following detailed description, changes and modifications of various kinds within the spirits and scope of the invention will become apparent to those skilled in the art.

BRIEF DESCRIPTION OF THE DRAWINGS

The present invention will be fully understood from the following detailed description and the accompanying drawings. The accompanying drawings only show examples and are not intended to restrict the present invention. In the accompanying drawings.

DETAILED DESCRIPTION

Hereinafter, an embodiment of the present invention will be described with reference to the drawings.

Figure 1:
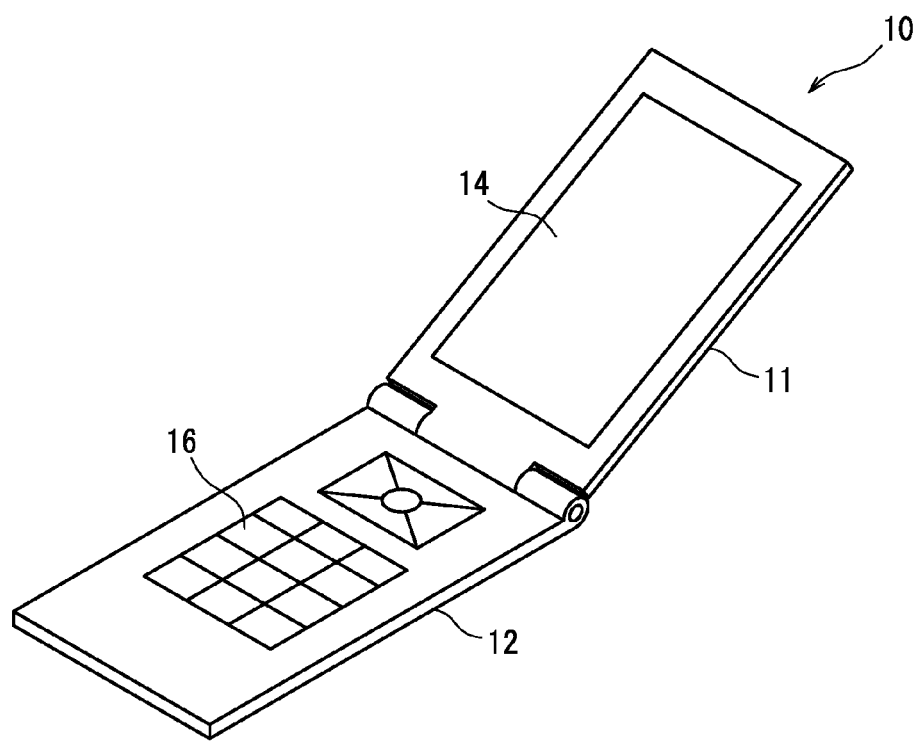
FIG. 1 is a perspective view showing a schematic structure of a mobile phone including an optical wiring using photoelectric conversion modules of an embodiment.

FIG. 1 is a perspective view schematically showing an outer appearance of a mobile phone 10. The mobile phone 10 is of, for example, a fold type, in which a first case 11 and a second case 12 are coupled via a hinge. A liquid crystal panel 14 is placed on the first case 11, and buttons 16 are placed on the second case 12, and a user is capable of obtaining information from an image displayed on the liquid crystal panel 14.

Figure 2:
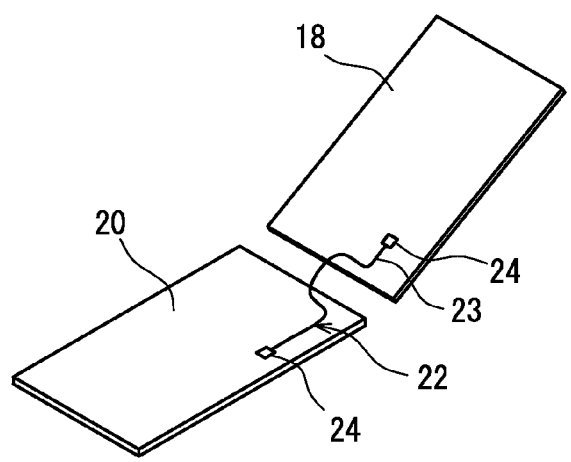
FIG. 2 is a perspective view schematically showing a first motherboard and a second motherboard used in the mobile phone in FIG. 1 as well as the optical wiring.

FIG. 2 shows a first motherboard 18 and a second motherboard 20 disposed in the first case 11 and the second case 12 respectively. Though not shown, electric components forming a driving circuit of the liquid crystal panel 14 are mounted on the first motherboard 18, and electric components forming an input circuit connected to the buttons 16, a communication circuit, and an image processing circuit are mounted on the second motherboard 20.

The driving circuit on the first motherboard 18 and the image processing circuit on the second motherboard 20 are connected by an optical wiring 22. That is, the driving circuit receives image data from the image processing circuit through the optical wiring 22 and makes the liquid crystal display panel 14 display an image based on the received image data.

[Photoelectric Conversion Module]

The optical wiring 22 is constituted by an optical fiber 23 and photoelectric conversion modules 24, 24 of an embodiment integrally provided at both ends of the optical fiber 23.

Figure 3:
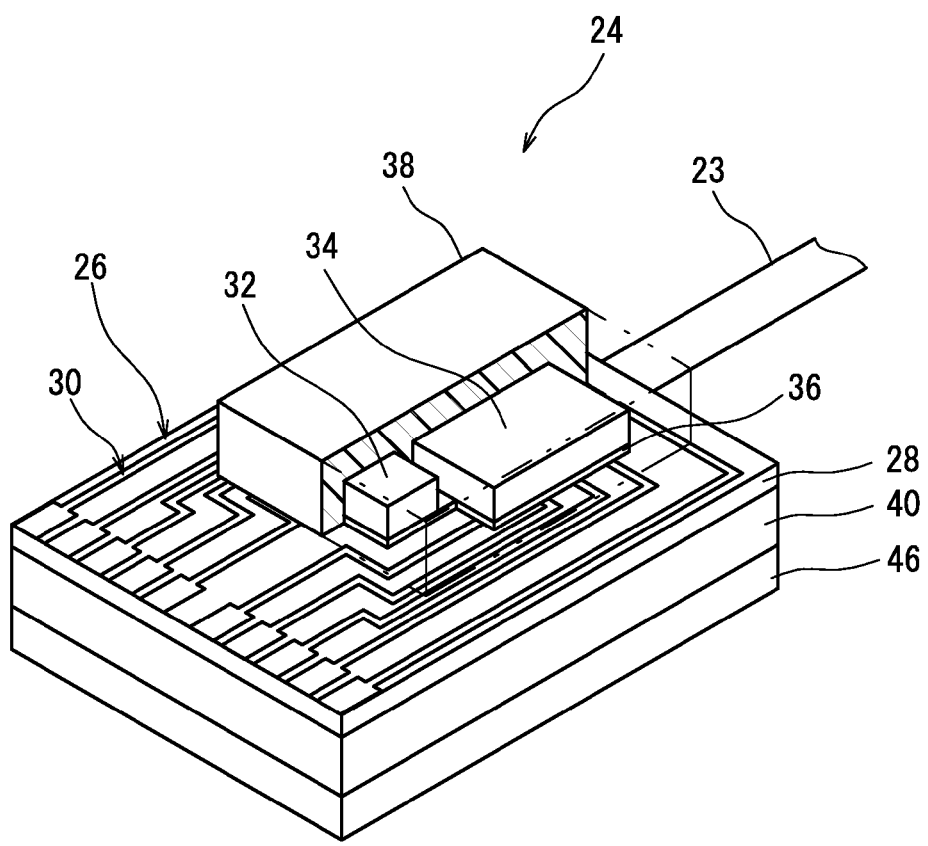
FIG. 3 is a perspective view schematically showing an outer appearance of the photoelectric conversion module of the embodiment.

FIG. 3 is a perspective view schematically showing an outer appearance of the photoelectric conversion module 24. The photoelectric conversion module 24 includes a FPC (flexible printed circuit) board 26, and the FPC board 26 is constituted by: a film 28 made of, for example, polyimide and having flexibility and a light transmitting property; and a conductor pattern 30 of metal such as, for example, copper provided on the film 28. A thickness of the film 28 is within a range of, for example, not less than 15 μm nor more than 50 μm, and is 25 μm in this embodiment.

On one surface (mounting surface) of the FPC board 26, a photoelectric conversion element 32 and an IC (integrated circuit) chip 34 are mounted by, for example, flip-chip.

In more detail, in the photoelectric conversion module 24 connected to the second motherboard 20, the photoelectric conversion element 32 is a light-emitting element such as LD (laser diode), and the IC chip 34 forms a driving circuit for driving the photoelectric conversion element 32.

In the photoelectric conversion module 24 connected to the first motherboard 18, the photoelectric conversion element 32 is a light-receiving element such as PD (photodiode) and the IC chip 34 forms an amplifier circuit for amplifying an electric signal output by the light-receiving element.

The photoelectric conversion element 32 is of a surface emitting type or of a surface receiving type, and its emission part or incident part is disposed to face the mounting surface.

Between the FPC board 26 and both of the photoelectric conversion element 32 and the IC chip 34, a filler member 36 made of resin and having a light transmitting property is provided, and further the photoelectric conversion element 32 and the IC chip 34 are covered by a mold member 38 made of resin. The filler member 36 and the mold member 38 protect the IC chip 34 and the photoelectric conversion element 32 while ensuring connection strength of the IC chip 34 and the photoelectric conversion element 32 to the FPC board 26.

Note that in FIG. 3, the mold member 38 is partly removed and the mold member 38 is partly shown in section.

Figure 4:
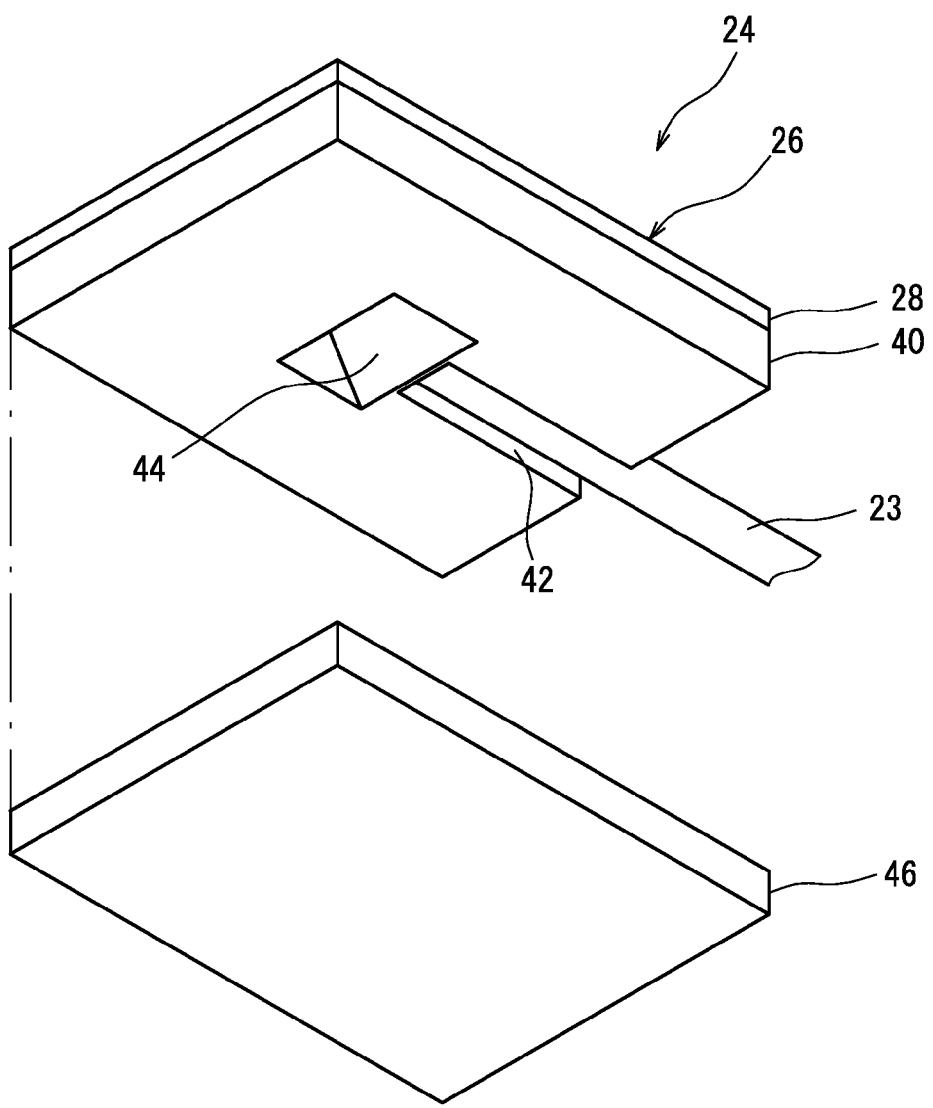
FIG. 4 is a perspective view schematically showing the outer appearance of the photoelectric conversion module in FIG. 3 seen from a different direction, with a reinforcing member being detached.

FIG. 4 is a schematic perspective view showing a side opposite the side shown in FIG. 3 of the photoelectric conversion module, with part thereof disassembled.

On the whole area of another surface (rear surface) of the FPC board 26, a resin layer 40 having a light transmitting property is integrally provided. In the resin layer 40, a holding groove 42 where to fix a tip portion of the optical fiber 23 is formed.

The holding groove 42 extends along the FPC board 26 in an arrangement direction of the photoelectric conversion element 32 and the IC chip 34 (hereinafter, simply referred to as an arrangement direction D). A cross-sectional shape of the holding groove 42 is a quadrangular shape, that is, an angular U-shape, and the holding groove 42 is a U-groove.

In terms of the arrangement direction D, one end, of the holding groove 42, located on the IC chip 34 side is opened in a side surface of the resin layer 40 and the other end is formed by a wall surface. Further, the holding groove 42 is also opened in a surface, of the resin layer 40, opposite the FPC board 26, and a bottom surface of the holding groove 42 is formed by the FPC board 26. The tip portion of the optical fiber 23 is fixed in the holding groove 42 by an adhesive, and a tip surface of the optical fiber 23 abuts on the wall surface of the holding groove 42.

Further, a V-groove is formed in the resin layer 40, and on a wall surface of the V-groove, a vapor deposition film made of metal such as, for example, Au is formed. The vapor deposition film forms a mirror 44, and the mirror 44 forms an optical element optically coupling the photoelectric conversion element 32 and the tip surface of the optical fiber 23 via the FPC board 26.

A reinforcing member 46 in a plate shape made of, for example, glass is bonded on the resin layer 40 by an adhesive. The reinforcing member 46 covers the holding groove 42, and with the resin layer 40, it firmly holds the tip portion of the optical fiber 23. An area of the reinforcing member 46 is, for example, substantially equal to a slightly smaller than an area of the FPC board 26.

Figure 5:
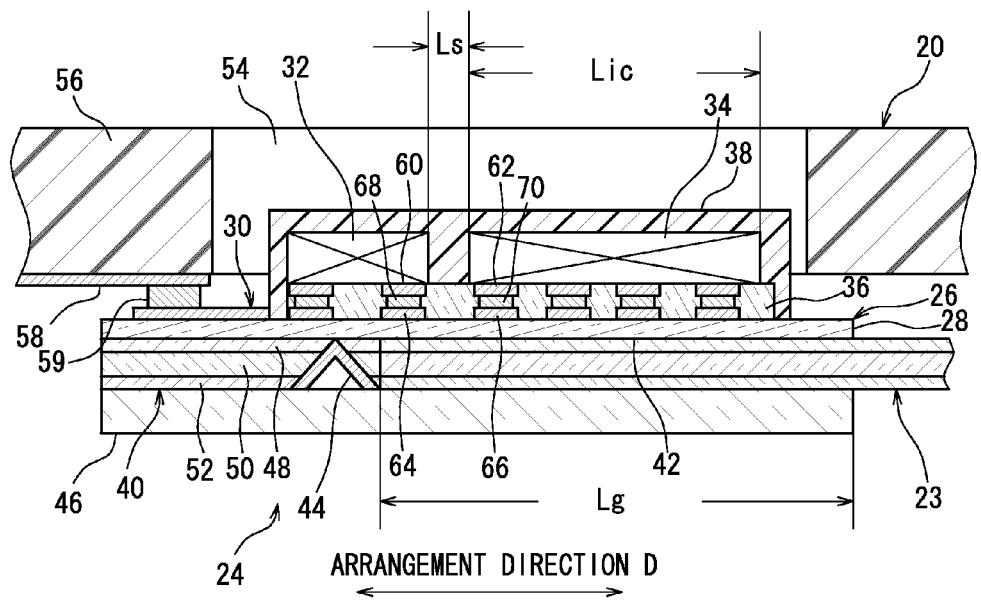
FIG. 5 is a schematic cross-sectional view of the photoelectric conversion module attached to the second motherboard.

FIG. 5 is a schematic cross-sectional view of the photoelectric conversion module 24 mounted on the second motherboard 20.

The resin layer 40 is constituted by a polymer optical waveguide member, and the polymer optical waveguide member includes an under clad layer 48, a core 50, and an over clad layer 52. The under clad layer 48 is stacked on the FPC board 26, and the core 50 having a quadrangular cross section when seen from an advance direction of an optical signal extends on the under clad layer 48.

The number of the cores 50 is one in correspondence to the number of the optical fibers 23, and the core 50 is located coaxially with the tip portion of the optical fiber 23. The over clad layer 52 is stacked on the under clad layer 48 and the core 50 so that the over clad layer 52 and the under clad layer 48 cooperatively surround the core 50.

Materials of the under clad layer 48, the core 50, and the over clad layer 52 are not particularly limited, but acrylic resin, epoxy resin, polyimide resin, or the like is usable, for instance.

In the second motherboard 20, a hole 54 is formed as a depression receiving the mold member 38. Note that a cutout may be formed instead of the hole 54 depending on a mounting position.

The second motherboard 20 is constituted by a rigid board main body 56 made of, for example, glass epoxy resin and a conductor pattern 58 made of a conductor such as copper. The conductor pattern 58 of the second motherboard 20 is connected to the conductor pattern 30 of the FPC board 26 via, for example, solder 59.

The photoelectric conversion element 32 and the IC chip 34 have, as input/output terminals, a plurality of electrode pads 60 and a plurality of electrode pads 62 respectively, and the conductor pattern 30 of the FPC board 26 has lands (electrode parts) 64, 66 corresponding to the electrode pads 60, 62. The electrode pads 60, 62 and the lands 64, 66 of the conductor pattern 30 are mutually connected by bumps 68, 70 made of, for example, Au.

In the photoelectric conversion module 24, in the arrangement direction D, a length Lic of the IC chip 34 in the case of 1 ch (channel) is, for example, not less than 500 μm nor more than 1000 μm, a length Ls of an interval between the photoelectric conversion element 32 and the IC chip 34 is, for example, not less than 50 μm nor more than 400 μm, and a length Lg of the holding groove 42 is, for example, not less than 600 μm nor more than 1500 μm.

Further, the length Lg of the holding groove 42 is preferably set so that a position of the tip surface of the optical fiber 23 is located beyond a side surface, of the IC chip 34, on the photoelectric conversion element 32 side toward the photoelectric conversion element 32, in terms of the arrangement direction D, and more preferably, it is set so that the position of the tip surface is between both side surfaces of the photoelectric conversion element 32.

Figure 6:
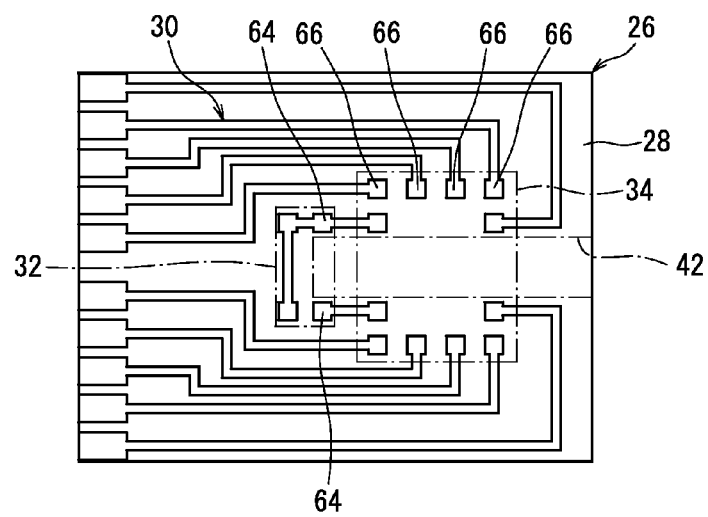
FIG. 6 is a schematic plane view of a FPC board in FIG. 3.

FIG. 6 is a plane view of the FPC board 26, showing positions of the photoelectric conversion element 32, the IC chip 34, and the holding groove 42 by dashed lines. In this embodiment, as a preferable form, center positions of the lands 64, 66 deviate from an area to which the holding groove 42 is projected. Note that peripheral edges of the lands 64, 66 may partly overlap with the area to which the holding groove 42 is projected.

The above-described photoelectric conversion module 24 is manufactured as follows, for instance.

First, after the resin layer 40 is formed on the FPC board 26, the holding groove 42 and the mirror 44 are sequentially formed in the resin layer 40. Thereafter, after the photoelectric conversion element 32 and the IC chip 34 are mounted on the FPC board 26 by flip-chip, the filler member 36 is filled, and they are covered by the mold member 38. Then, after the tip portion of the optical fiber 23 is fixed in the holding groove 42, the reinforcing member 46 is bonded, whereby the photoelectric conversion module 24 is manufactured.

In the photoelectric conversion module 24 of the above-described embodiment, in terms of the arrangement direction D, the holding groove 42 has the open end on the IC chip 34 side, and the tip portion of the optical fiber 23 extending through the open end extends in parallel to the IC chip 34.

According to this arrangement structure, even if the FPC board 26 extends beyond the IC chip 34 only by a short length, a sufficient length is secured to fix the tip portion of the optical fiber 23 to the FPC board 26 and the resin layer 40, so that the tip portion of the optical fiber 23 is firmly fixed. Therefore, according to this photoelectric conversion module 24, the downsizing is achieved while connection strength of the tip portion of the optical fiber 23 is ensured.

In the photoelectric conversion module 24 of the above-described embodiment, since the center positions of the lands 64, 66 are outside the projection area of the holding groove 42, the lands 64, 66 do not bend when the photoelectric conversion element 32 and the IC chip 34 are mounted, resulting in the sure mounting.

Further, in the manufacturing method of the photoelectric conversion module 24 of the above-described embodiment, the tip portion of the optical fiber 23 is fixed after the photoelectric conversion element 32 and the IC chip 34 are mounted, which facilitates the mounting of the photoelectric conversion element 32 and the IC chip 34.

As described hitherto, according to the present invention, there is provided a highly reliable photoelectric conversion module in which connection strength of a tip portion of an optical fiber is ensured even when the photoelectric conversion module is downsized.

The present invention is not limited to the above-described embodiment and includes embodiments in which changes are made in the embodiment.

For example, in the photoelectric conversion module 24 of the above-described embodiment, the FPC board 26 side is connected to the second motherboard 20, but the reinforcing member 46 side may be connected to the second motherboard 20. Through holes are provided in the FPC board 26 and the resin layer 40, and plated conductors are provided in the through holes. In this case, the reinforcing member 46 is smaller than the resin layer 40, and the plated conductors are exposed in an area, of the resin layer 40, not covered by the reinforcing member 46.

Figure 7:
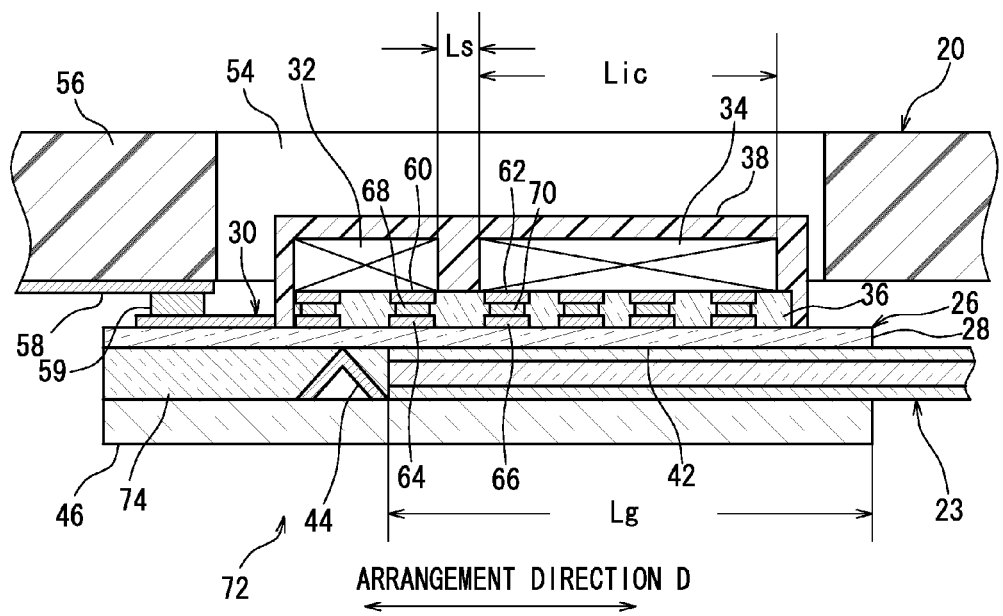
FIG. 7 is a schematic cross-sectional view of a photoelectric conversion module of a modification example attached to the second motherboard.

In the photoelectric conversion module 24 of the above-described embodiment, the resin layer 40 is constituted by the polymer optical waveguide member, but if an optical path between the tip surface of the optical fiber 23 and the photoelectric conversion element 32 is short, a resin layer 74 made of single resin having a light transmitting property may be used as in a photoelectric conversion module of a modification example shown in FIG. 7.

Figure 8:
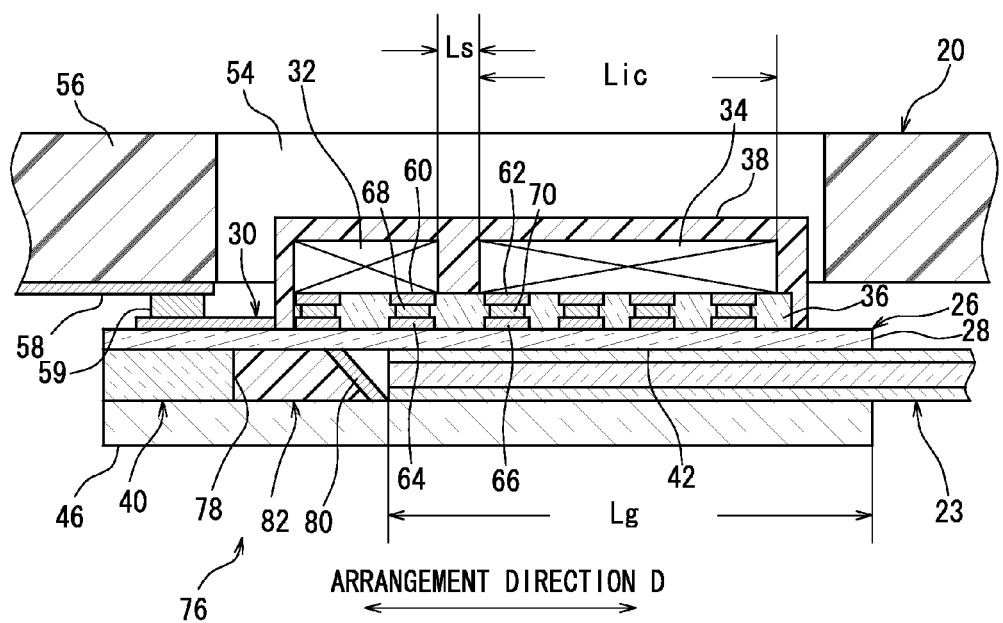
FIG. 8 is a schematic cross-sectional view of a photoelectric conversion module of a modification example attached to the second motherboard.

In the photoelectric conversion module 24 of the above-described embodiment, the mirror 44 is formed on the wall surface of the V-groove of the resin layer 40, but another alternative structure may be to provide a concave portion 78 in the resin layer 40 and dispose, in the concave portion 78, a mirror member 82 having a mirror 80 as in a photoelectric conversion module 76 of a modification example shown in FIG. 8.

Finally, the optical wiring including the photoelectric conversion module of the present invention is applicable to information processing devices other than mobile phones, network devices, digital AV devices, and home electric appliances. More specifically, the photoelectric conversion module is also applicable to, for example, a personal computer, a switching hub, a HDMI (trademark: High Definition Multimedia Interface) cable, and so on.

EXPLANATION OF NUMERALS AND SYMBOLS 22 optical wiring
23 optical fiber
24 photoelectric conversion module
26 FPC board (circuit board)
28 film
32 photoelectric conversion element
34 IC chip
40 resin layer
42 holding groove
44 mirror (optical element)
46 reinforcing member

What is claimed is:

1. A photoelectric conversion module comprising:
    a circuit board having a light transmitting property and flexibility;
    an IC chip and a photoelectric conversion element mounted adjacent to each other on a first surface of said circuit board;
    a resin layer provided on a second surface of said circuit board and having a holding groove formed along said circuit board;
    an optical fiber having a tip portion disposed in said holding groove;
    a reinforcing member covering the holding groove of said resin layer; and
    a mirror optically coupling a tip of said optical fiber and said photoelectric conversion element via said circuit board,
    wherein:
        the holding groove has an open end at an end of said resin layer located on a side of said IC chip with respect to an arrangement direction of said IC chip and said photoelectric conversion element; and
        at least part of the tip portion of said optical fiber extends along said IC chip from said open end toward a side of said photoelectric conversion element with respect to the arrangement direction.

2. The photoelectric conversion module according to claim 1, wherein the tip of said optical fiber is located beyond a side surface of said IC chip on the side of said photoelectric conversion element with respect to the arrangement direction.

3. The photoelectric conversion module according to claim 2, wherein:
    said circuit board has, on the first surface, a plurality of electrode parts to which input/output terminals of said photoelectric conversion element and said IC chip are connected; and at least centers of the electrode parts are located outside an area, of the first surface, to which the holding groove is projected.

4. The photoelectric conversion module according to claim 3, wherein:
a V-groove is formed in said resin layer; and
said mirror comprises a metal film vapor-deposited on a wall surface of the V-groove.

5. The photoelectric conversion module according to claim 4, wherein said resin layer comprises a polymer optical waveguide member including a core and a clad.

6. The photoelectric conversion module according to claim 3, wherein:
a concave portion is formed in said resin layer; and
a mirror member having said mirror is disposed in the concave portion.

7. The photoelectric conversion module according to claim 6, wherein said resin layer comprises a polymer optical waveguide member including a core and a clad.

8. The photoelectric conversion module according to claim 2, wherein:
a V-groove is formed in said resin layer; and
said mirror comprises a metal film vapor-deposited on a wall surface of the V-groove.

9. The photoelectric conversion module according to claim 8, wherein said resin layer comprises a polymer optical waveguide member including a core and a clad.

10. The photoelectric conversion module according to claim 2, wherein:
a concave portion is formed in said resin layer; and
a mirror member having said mirror is disposed in the concave portion.

11. The photoelectric conversion module according to claim 10, wherein said resin layer comprises a polymer optical waveguide member including a core and a clad.

12. The photoelectric conversion module according to claim 1, wherein:
said circuit board has, on the first surface, a plurality of electrode parts to which input/output terminals of said photoelectric conversion element and said IC chip are connected; and
at least centers of the electrode parts are located outside an area, of the first surface, to which the holding groove is projected.

13. The photoelectric conversion module according to claim 12, wherein:
a V-groove is formed in said resin layer; and
said mirror comprises a metal film vapor-deposited on a wall surface of the V-groove.

14. The photoelectric conversion module according to claim 12, wherein:
a concave portion is formed in said resin layer; and
a mirror member having said mirror is disposed in the concave portion.

15. The photoelectric conversion module according to claim 12, wherein said resin layer comprises a polymer optical waveguide member including a core and a clad.

16. The photoelectric conversion module according to claim 1, wherein:
a V-groove is formed in said resin layer; and
said mirror comprises a metal film vapor-deposited on a wall surface of the V-groove.

17. The photoelectric conversion module according to claim 16, wherein said resin layer comprises a polymer optical waveguide member including a core and a clad.

18. The photoelectric conversion module according to claim 1, wherein:
a concave portion is formed in said resin layer; and
a mirror member having said mirror is disposed in the concave portion.

19. The photoelectric conversion module according to claim 18, wherein said resin layer comprises a polymer optical waveguide member including a core and a clad.

20. The photoelectric conversion module according to claim 1, wherein said resin layer comprises a polymer optical waveguide member including a core and a clad.

* * * * *